United States Patent
Nahmias et al.

(10) Patent No.: US 10,837,827 B2
(45) Date of Patent: Nov. 17, 2020

(54) SYSTEM AND METHOD FOR PHOTONIC ANALOG-TO-DIGITAL CONVERSION

(71) Applicant: Luminous Computing, Inc., Menlo Park, CA (US)

(72) Inventors: Mitchell A. Nahmias, Menlo Park, CA (US); Michael Gao, Menlo Park, CA (US)

(73) Assignee: Luminous Computing, Inc., Menlo Park, CA (US)

(*) Notice: Subject to any disclaimer, the term of this patent is extended or adjusted under 35 U.S.C. 154(b) by 0 days.

(21) Appl. No.: 16/826,008

(22) Filed: Mar. 20, 2020

(65) Prior Publication Data

US 2020/0300695 A1    Sep. 24, 2020

Related U.S. Application Data

(60) Provisional application No. 62/821,838, filed on Mar. 21, 2020.

(51) Int. Cl.
    *G01J 1/44*           (2006.01)
    *G01J 1/04*           (2006.01)
    *H03M 1/12*         (2006.01)

(52) U.S. Cl.
    CPC .............. *G01J 1/44* (2013.01); *G01J 1/0437* (2013.01); *H03M 1/12* (2013.01)

(58) Field of Classification Search
    CPC .............. G01J 1/44; G01J 1/0437; H03M 1/12
    USPC .......................................... 341/137, 144, 155
    See application file for complete search history.

(56) References Cited

U.S. PATENT DOCUMENTS

| | | | | |
|---|---|---|---|---|
| 9,176,361 | B2* | 11/2015 | Sartor | G02F 7/00 |
| 9,197,471 | B1* | 11/2015 | Zanoni | H04L 27/223 |
| 9,407,369 | B2* | 8/2016 | Yu | H04H 40/90 |
| 10,009,135 | B2 | 6/2018 | Tait et al. | |
| 2019/0331912 | A1 | 10/2019 | Tait et al. | |

OTHER PUBLICATIONS

Khilo, Anatol, et al., "Photonic ADC: overcoming the bottleneck of electronic jitter", Feb. 13, 2012 / vol. 20, No. 4 / Optic Express.
Konishi, Tsuyoshi, et al., "Five-bit parallel operation of optical quantization and coding for photonics analog-to-digital conversion", Aug. 15, 2011 / vol. 19, No. 17 / Optics Express.
Shile, Wei, et al., "Multimode interference coupler based photonics analog-to-digital conversion scheme", Sep. 1, 2012 / vol. 37, No. 17 / Optics Letters.
Valley, George C., "Photonic analog-to-digital converters", Mar. 5, 2007 / vol. 15, No. 5 / Optics Express.

\* cited by examiner

*Primary Examiner* — Brian K Young
(74) *Attorney, Agent, or Firm* — Jeffrey Schox; Samuel Rosenthal

(57) ABSTRACT

A system for analog-to-digital conversion, preferably including one or more optical inputs, optical sources, phase remodulators, and/or photonic circuits, and optionally including detector banks and/or digital electronics. A method for analog-to-digital conversion, preferably including receiving an optical input signal, generating a phase-modulated optical signal, and/or generating a plurality of optical outputs, and optionally including generating a plurality of electrical outputs and/or encoding a digital representation of the outputs.

20 Claims, 16 Drawing Sheets

SYSTEM AND METHOD FOR PHOTONIC ANALOG-TO-DIGITAL CONVERSION

CROSS-REFERENCE TO RELATED APPLICATIONS

This application claims the benefit of U.S. Provisional Application Ser. No. 62/821,838, filed on 21 Mar. 2019, which is incorporated in its entirety by this reference.

TECHNICAL FIELD

This invention relates generally to the analog-to-digital conversion field, and more specifically to a new and useful system and method for photonic analog-to-digital conversion.

BACKGROUND

Typical electronic analog-to-digital converters require significant energy (e.g., for both sampling and quantization), which can present a challenge in energy-constrained applications. Thus, there is a need in the analog-to-digital conversion field to create a new and useful system and method for photonic analog-to-digital conversion.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. Overview.

Figure 1A:
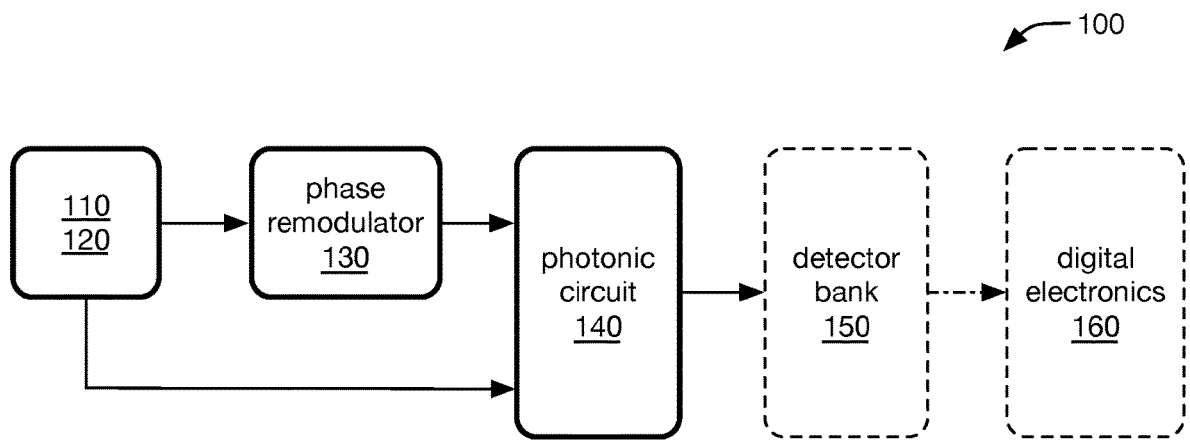
FIGS. 1A-1D are schematic representations of a first, second, third, and fourth embodiment, respectively, of a system for analog-to-digital conversion.
Figure 1B:
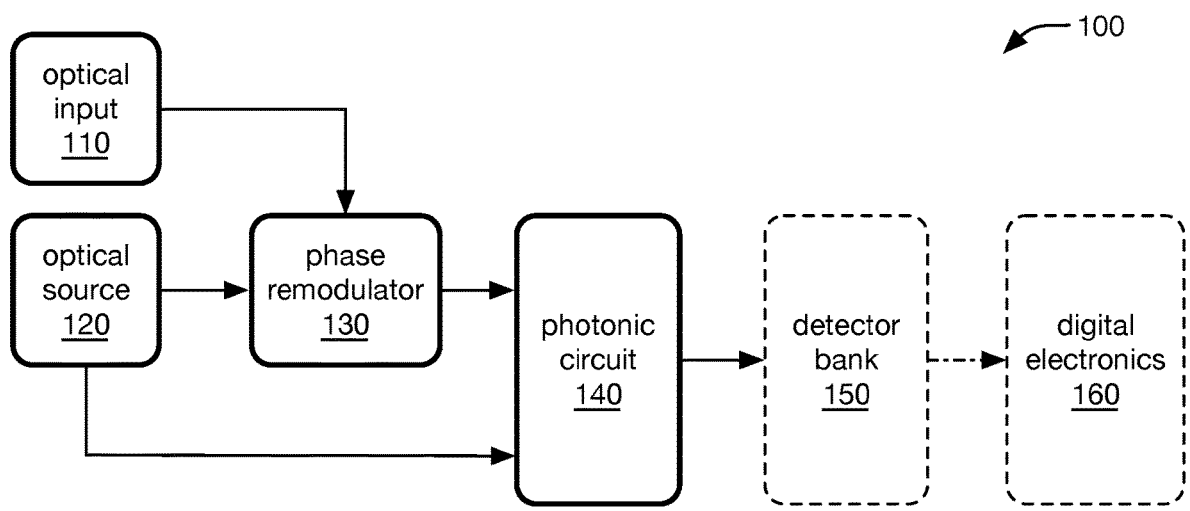
Figure 2A:
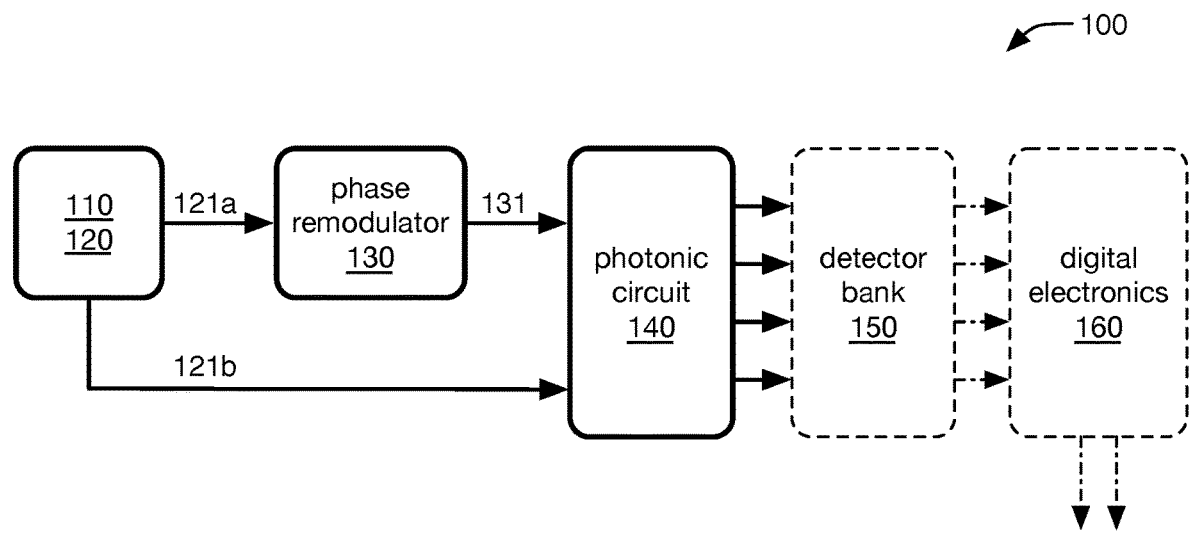
FIGS. 2A-2D are schematic representations of variations of the first, second, third, and fourth embodiments, respectively, of the system.

A system 100 for analog-to-digital conversion preferably includes one or more: optical inputs 110, optical sources 120, phase remodulators 130, and/or photonic circuits 140 (e.g., as shown in FIGS. 1A, 1B, 2A, and/or 2B). The system 100 can optionally include detector banks 150, digital electronics 160, and/or any other suitable elements.

Figure 3:
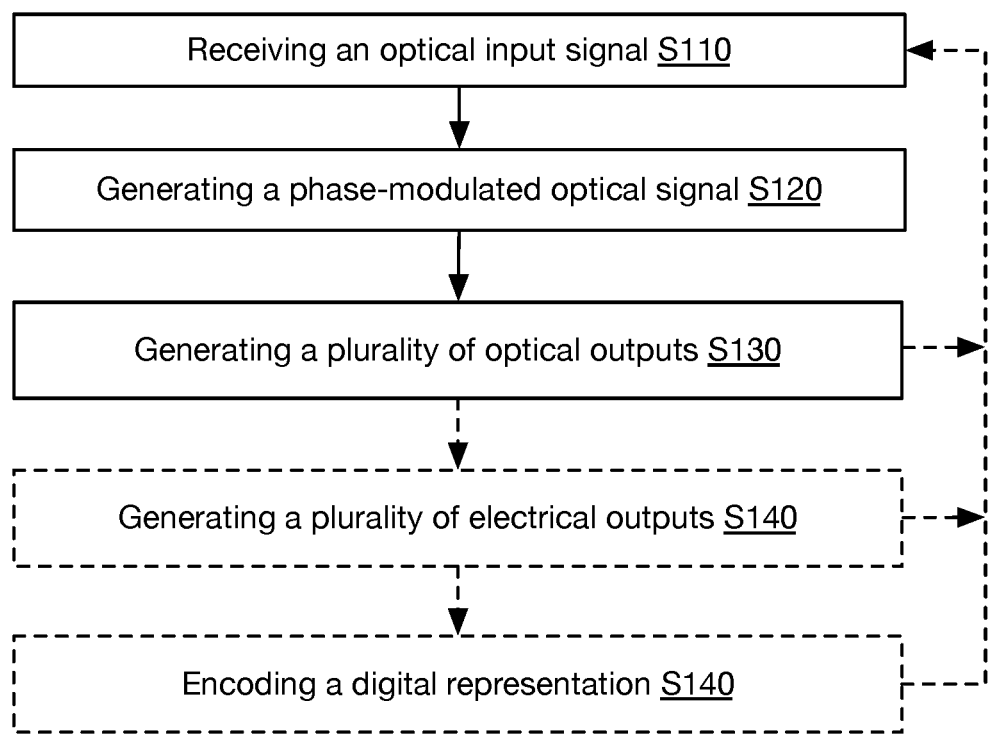
FIG. 3 is a schematic representation of a method for analog-to-digital conversion.

A method 200 for analog-to-digital conversion preferably includes: receiving an optical input signal S210, generating a phase-modulated optical signal S220, and/or generating a plurality of optical outputs S230 (e.g., as shown in FIG. 3). The method 200 can optionally include: generating a plurality of electrical outputs S240, encoding a digital representation of the outputs S250, and/or any other suitable elements.

The system 100 and/or method 200 preferably function to convert one or more optical analog inputs into digital outputs (e.g., digital electronic outputs, such as binary encodings indicative of the analog input values). However, the system and/or method can additionally or alternatively perform any other suitable functions.

The system and/or elements thereof are preferably implemented as one or more integrated circuits. For example, the photonic modules (e.g., input module, computation module) and/or subsets thereof can be and/or include one or more photonic integrated circuits, and/or the entire system can be a portion of a single integrated circuit. However, the system can additionally or alternatively be implemented in any other suitable device structure(s).

2. System.

2.1 Optical Input.

The optical input 110 preferably functions to provide an analog optical signal to digitize. The optical signal is preferably represented by (e.g., encoded as) the light intensity of the optical input, but can additionally or alternatively be represented by (e.g., encoded as) any other suitable characteristic(s) of the optical input, such as phase (e.g., phase delay relative to some reference, such as a self-reference, a separate phase reference signal, the optical source 120 and/or the light path 121b, etc.). The optical input (e.g., the encoded signal, such as the intensity and/or phase) preferably changes over time (e.g., changing quickly, such as at 1, 2.5, 5, 10, 20, 50, 0.5-2, 1-4, 2.5-10, 5-25, or 20-100 GSa/s, etc.), but can alternatively be static or substantially static. In some embodiments, the optical input is the output of an analog computation (e.g., vector dot product), such as a photonic computation. Additionally or alternatively, the optical input can be representative of other information (e.g., information received, such as from another element of a photonic computer, via an optical link), such as encoding analog information (e.g., using pulse-amplitude modulation, such as PAM-16 and/or PAM of any other suitable level(s), etc.) and/or any other suitable information.

The optical input is preferably a single-channel input (e.g., single wavelength and/or narrow band light, single-mode light, etc.) but can alternatively include multiple channels. For example, the wavelength channel(s) can include one or more channels near (e.g., within a threshold distance of, substantially centered around, etc.) the 1.3 micron and/or 1.55 micron wavelength (e.g., within the 1.26-1.36 micron O-band, within the 1.53-1.565 micron C-band and/or the 1.565-1.625 micron L-band, etc.), wherein the wavelengths described herein preferably refer to the wavelength the light would have in free space, rather than to the wavelength of the light in the medium through which it is propagating. The wavelength channels are preferably narrow-band channels, such as channels of less than a threshold bandwidth (e.g., 1, 2, 5, 10, 15, 25, 40, 65, 100, 200, 500, 1000 GHz, 1-5, 5-20, 20-100, 100-300, and/or 300-1000 GHz frequency bandwidth; 0.01, 0.02, 0.05, 0.1, 0.2, 0.5, 1, 2, 5, 10, 0.01-0.05, 0.05-0.2, 0.2-1, 1-3, or 3-100 nm spectral bandwidth; etc.), but can additionally or alternatively include intermediate- and/or wide-band channels and/or channels of any other suitable widths. The channels can additionally or alternatively be associated with optical modes (e.g., transverse spatial modes, polarization modes, etc.) and/or any other suitable optical characteristics. Alternatively, a single transducer can control multiple emission channels, and/or the transducers can emit light of any other suitable wavelength(s) and/or other optical characteristics. The emitted and/or modulated light preferably has a bandwidth significantly narrower than the width of the associated channel, such as narrower by at least a threshold relative amount (e.g., less than 0.01, 0.03, 0.1, 0.2, 0.3. 0.4, 0.5, 0.001-0.01, 0.01-0.1, 0.1-0.3, 0.3-0.5, or more than 0.5 times the width of the associated channel, etc.) and/or absolute amount (e.g., 0.1, 0.2, 0.5, 1, 2, 5, 10, 15, 20, 30, 40, 50, 75, 100, 150, 250, 0.1-1, 1-5, 5-15, 15-45, 45-100, or 100-300 GHz, etc.), more preferably wherein the light is farther than a threshold amount (e.g., 0.25-1 times the threshold amounts described above) from either edge of the associated channel. The emitted and/or modulated light is preferably substantially centered within the associated channel (e.g., within a threshold amount of the center, such as 0.25-1 times the threshold amounts described above), but can alternatively be located at any other suitable location within the channel. The emitted light, and preferably also the modulated light (e.g., including some modulation sidebands, such as sidebands with greater than a threshold intensity and/or substantially any sidebands), of any emitter is preferably contained (or substantially contained) within a single such channel (but can alternatively span multiple channels). In one example, the emitted light has a linewidth less than a first threshold amount (e.g., 0.3, 1, 3, 10, 30, 100, 300, 1000, 3000, 0.3-3, 3-300, and/or 300-10,000 MHz, etc.), and/or the modulated light (e.g., modulated by a signal of 0.1-30 GHz, such as 3 GHz) occupies less than a second threshold amount of spectrum (e.g., 0.1, 0.2, 0.5, 1, 2, 3, 5, 6, 8, 10, 30, 100, 0.1-0.3, 0.3-1, 1-3, 3-8, 8-20, and/or 20-100 GHz, etc.). However, the emitted and/or modulated light can additionally or alternatively occupy any other suitable amount of the spectrum.

In some embodiments, some or all of the channels are preferably non-overlapping, preferably having at least (and/or at most) a threshold spacing (e.g., threshold amount relative to the channel width, such as 5, 10, 25, 50, 100, 110, 125, 150, 175, 200, 250, 300, 400, 500, 0-1, 1-5, 5-15, 15-30, 30-60, 60-100, 100-110, 110-120, 120-150, 150-200, 200-300, or 300-500% of the channel width; absolute threshold amount, such as 0.1, 0.2, 0.5, 1, 2, 5, 10, 15, 20, 30, 40, 50, 75, 100, 150, 250, 0.1-1, 1-5, 5-15, 15-45, 45-100, or 100-300 GHz; etc.) between each other (e.g., center-to-center distance, edge-to-edge distance, etc.). However, all or some of the channels can alternatively be overlapping (e.g., by no more and/or no less than a threshold amount, such as described above regarding the threshold spacing) and/or have any other suitable relationship to each other. The channels can additionally or alternatively be associated with optical modes (e.g., transverse spatial modes, polarization modes, etc.) and/or any other suitable optical characteristics.

In some embodiments, the system 100 (e.g., the optical input 110) includes and/or is coupled (e.g., by one or more photonic buses, by an optical network such as a network-on-chip, etc.) to a photonic computer (or one or more photonic computing elements, such as a photonic processor), such as a photonic computer including systems and/or implementing methods such as described in U.S. Pat. No. 10,009,135, issued 26 Jun. 2018 and titled "System and Method for Photonic Processing", which is hereby incorporated in its entirety by this reference. For example, the optical input 110 can be configured to receive an optical signal from the photonic computing element(s).

However, the system can additionally or alternatively include any other suitable optical inputs.

2.2 Optical Source.

The optical source 120 preferably functions to provide light to be modulated (i.e., to provide one or more optical carriers). The optical source preferably includes two light paths 121a, 121b. The optical source preferably includes a splitter 122 (e.g., a one-to-one splitter) defining the two paths (e.g., wherein a single optical source enters the splitter and emerges as two substantially equal optical outputs on the two paths, such as shown by way of example in FIG. 4A). Alternatively, the optical source 120 can include two separate sources, preferably substantially identical sources and/or sources with a fixed or otherwise known phase and/or intensity relationship, but alternatively any other suitable sources. The optical source can be a single-channel source, multi-channel source, and/or any other suitable source.

Figure 6A:
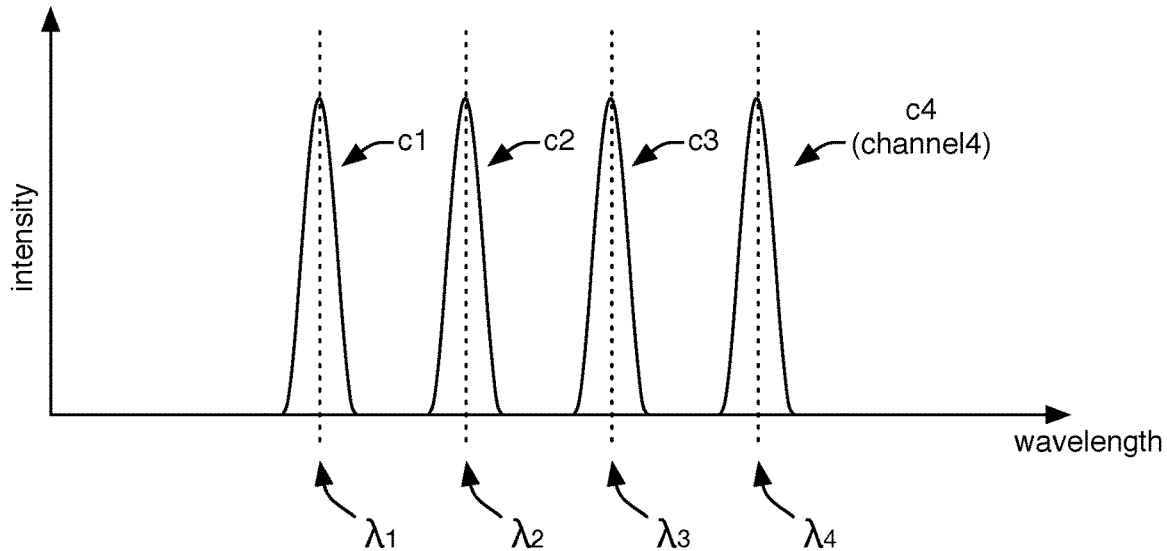
FIG. 6A is a representation of an example multi-channel spectrum.

In a first example, the optical source includes a single wavelength band (e.g., the same band as the optical input, a different band, etc.). In a second example, the optical source includes multiple wavelength bands, preferably multiple narrow-band signals (e.g., multiple distinct wavelength-based channels, such as shown by way of example in FIG. 6A). The wavelength bands can substantially span a modulation range of the phase remodulator 130 (e.g., for a predetermined modulator control signal range, such as +1 V of applied voltage), such as shown by way of example in FIG. 6B. In specific examples, the optical source includes 2, 3, 4, 8, 16, 32, 64, 2-4, 4-8, 8-16, 16-64, or more than 64 wavelength bands.

In a first embodiment, the optical source 120 is the same as the optical input 110, wherein the same light functions as both the input 110 and the source 120 (e.g., as shown in FIGS. 1A, 2A, and/or 4A).

Figure 2B:
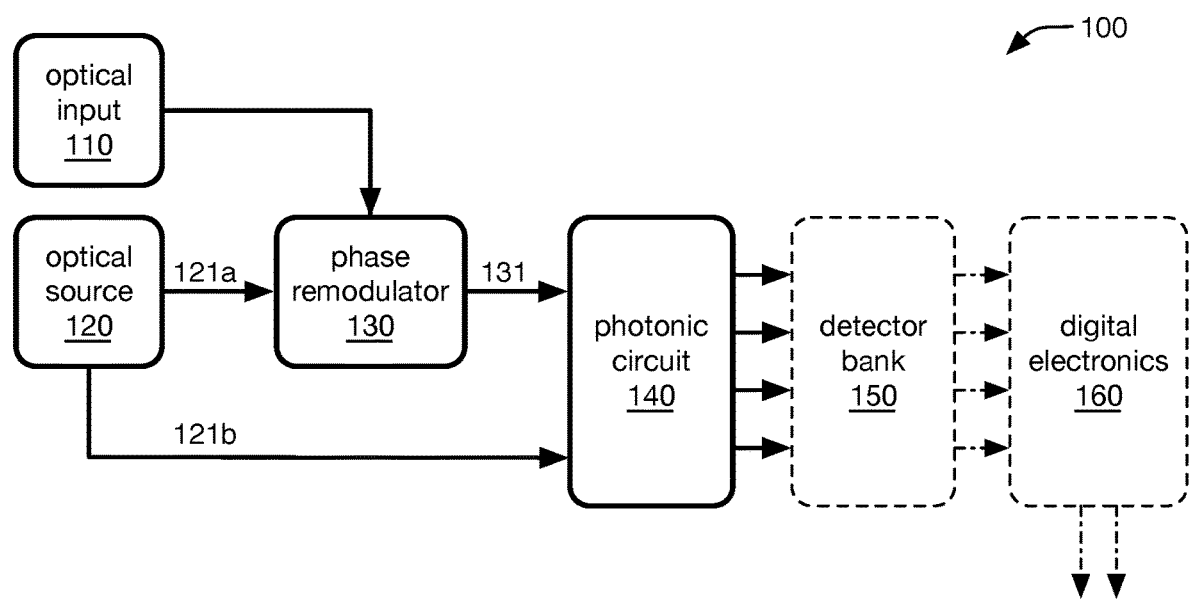
Figure 2C:
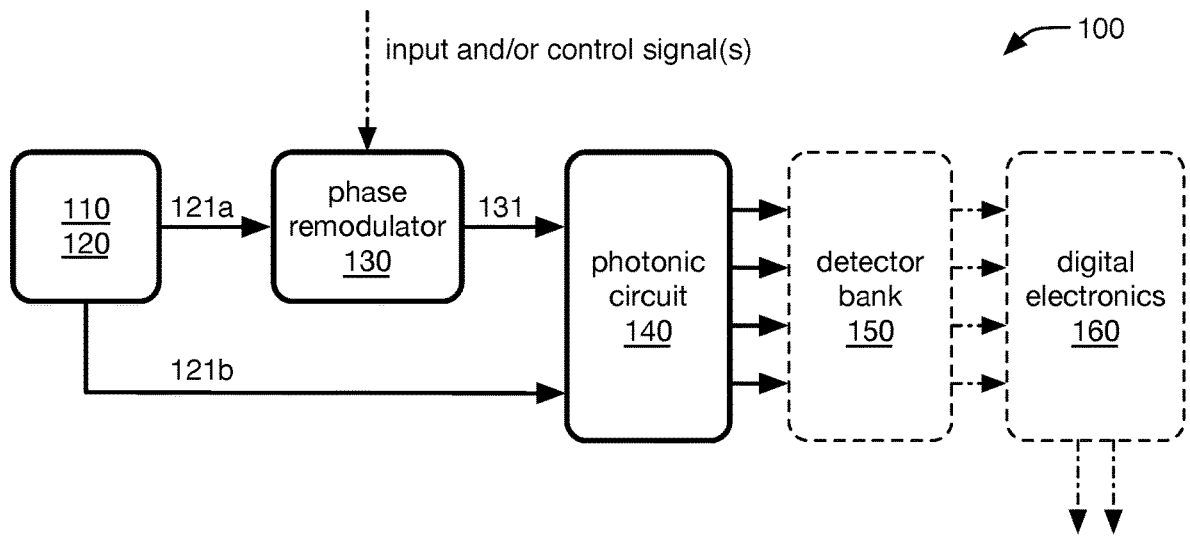
Figure 2D:
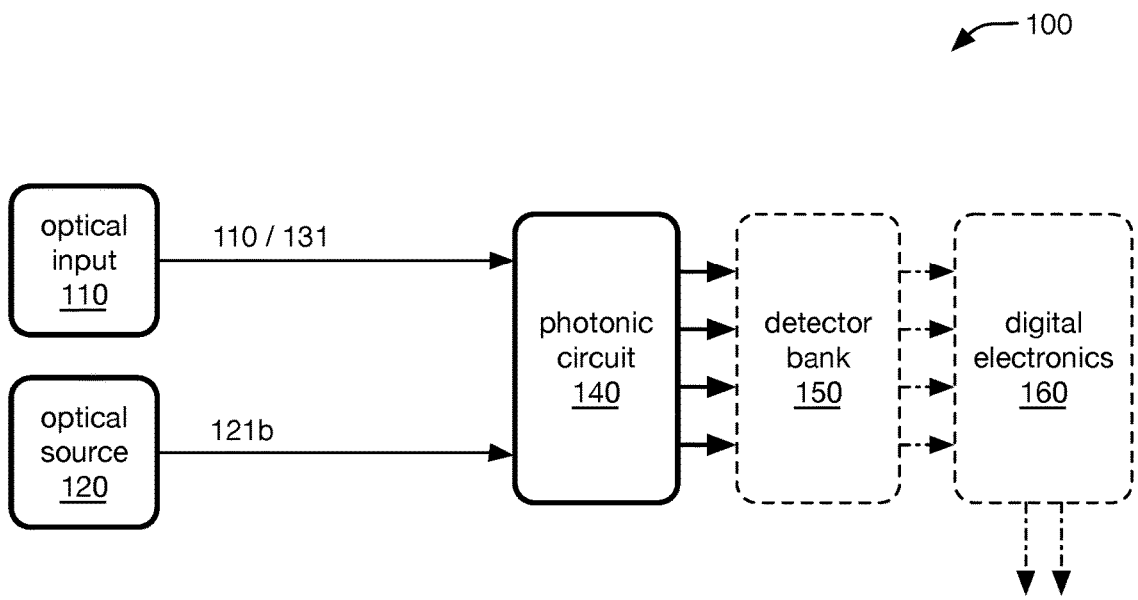

In a second embodiment, the optical source 120 is independent from (e.g., separate from) the optical input 110 (e.g., as shown in FIG. 1B, 2B, and/or 4B). In this embodiment, the optical source is preferably substantially static (e.g., has a substantially constant intensity), but can alternatively change (e.g., over time) in any suitable manner.

However, the system can additionally or alternatively include any other suitable optical source in any suitable arrangement.

2.3 Phase Remodulator.

The phase remodulator 130 preferably functions to modulate (e.g., phase modulate) a path 121a of the optical source (e.g., based on the optical input intensity). The phase remodulator preferably outputs a phase-modulated optical signal 131 (e.g., resulting from modulation of the light on path 121a, propagating along the path defined by path 121a, etc.).

Figure 4A:
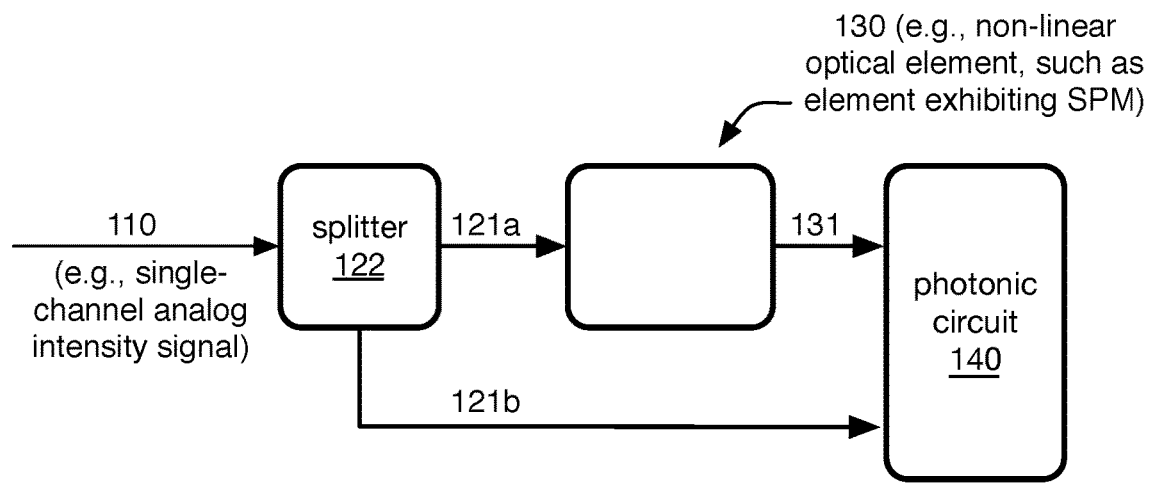
FIGS. 4A-4C are schematic representations of a first, and second, and third embodiment, respectively, of a phase remodulator.

In a first embodiment, in which the input 110 is the same as the source 120, the phase remodulator preferably uses one or more non-linear optical effects to modulate the path 121a (e.g., as shown in FIG. 4A). In this embodiment, the phase remodulator preferably includes one or more optical elements (e.g., resonators and/or waveguides, etc.) in which the desired non-linear optical effects can arise ("non-linear optical element"), such as photonic crystal structures (e.g., silicon-based photonic crystals) and/or slow light enhanced waveguides, but can additionally or alternatively include any other suitable structures (e.g., structures in which the desired non-linear optical effects can arise). The non-linear effects can include, for example: Kerr effect, two-photon absorption (TPA), free carrier dispersion (FCD), free carrier absorption (FCA), Pockels effect, and/or any other suitable non-linear optical effects. The non-linear effects can optionally be exploited in combination with one or more modulator controls (e.g., based on one or more control signals, such as applying reverse bias across the modulator to negate FCD and/or FCA effects). These effects can result in one or more functional operations such as self-phase modulation (SPM), cross-phase modulation (XPM), creation of bistability and/or threshold states, and/or any other suitable operations. Such functional operations are preferably applied to achieve the desired phase modulation, but can additionally or alternatively be used in any other suitable manner.

Figure 4B:
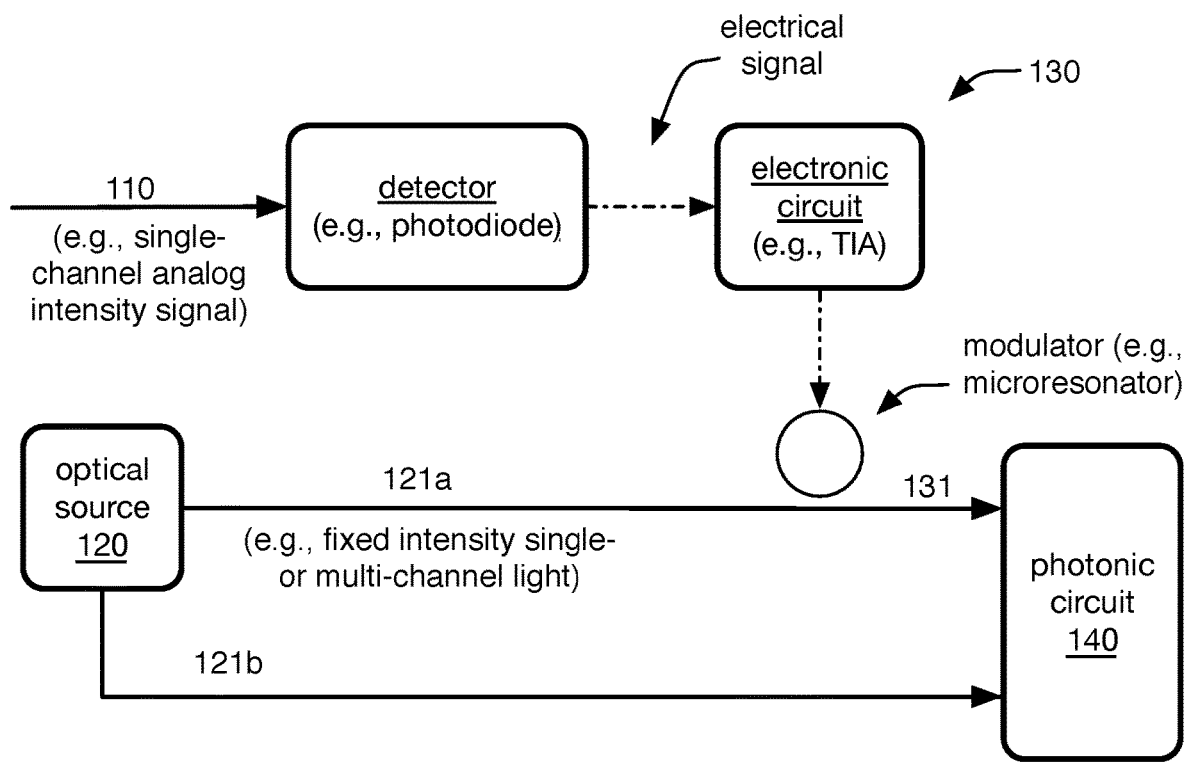

In a second embodiment, the input 110 is distinct from the source 120. In a first variation of this embodiment, the phase remodulator preferably generates an electrical signal based on the input 110 and uses the electrical signal to modulate the path 121a (e.g., as shown in FIG. 4B). In this variation, the phase remodulator preferably includes one or more detectors (e.g., photodiodes) and transducers. For example, the phase remodulator can include detectors and/or transducers such as described in U.S. Pat. No. 10,009,135, issued 26 Jun. 2018 and titled "System and Method for Photonic Processing", which is hereby incorporated in its entirety by this reference.

The transducer preferably includes one or more optical modulators (and/or other optical modulation elements), such as phase modulators. The optical modulator is preferably wavelength-selective (e.g., substantially modulating only a narrow wavelength band, such as substantially modulating only light of a single channel), but can alternatively be a wideband modulator (e.g., substantially modulating light of multiple channels, substantially modulating all wavelengths present and/or in use in the optical source and/or signal, etc.) and/or have any other suitable wavelength dependence. The optical modulator can be electro-absorptive and/or electro-refractive. The optical modulator can optionally be embedded in one or more other structures, such as a resonator and/or Mach-Zehnder interferometer (MZI) (e.g., which can function to enhance its modulation performance). In examples, the optical modulator can include one or more microresonators (e.g., microring resonator, microdisk resonator, photonic crystal defect state modulator), quantum confined Stark effect (QCSE) modulator, Zeno effect modulator (e.g., graphene based modulator, such as a silicon photonic graphene modulator), MZI modulator, electro-absorptive modulator embedded in a critically coupled resonator (e.g., QCSE microdisk modulator), photonic crystal-based modulator, and/or any other suitable optical modulator. The optical modulator (e.g., wideband modulator) can optionally be embedded in and/or in series (along the optical path) with one or more filters (e.g., spectral filters), such as an electro-absorptive modulator preceded (along the optical path) by a first filter and followed by a second filter. In some variations, the optical modulator includes multiple microresonators (e.g., as described in U.S. patent application Ser. No. 16/374,991, filed 4 Apr. 2019 and titled "Photonic Filter Bank System and Method of Use", which is hereby incorporated in its entirety by this reference). The optical modulators can additionally or alternatively include mode modulators (e.g., as described in Lian-Wee Luo, Noam Ophir, Christine P. Chen, Lucas H. Gabrielli, Carl B. Poitras, Keren Bergmen, and Michal Lipson, "WDM-compatible mode-division multiplexing on a silicon chip," *Nat. commun.* 5, 3069 (2014), which is hereby incorporated in its entirety by this reference). In some variations, the optical modulator includes multiple filters and/or modulators coupled together using inverse design (e.g., as described in Molesky, S., Lin, Z., Piggott, A. Y. et al., "Inverse design in nanophotonics," *Nat. photon.* 12, 659-670 (2018), which is hereby incorporated in its entirety by this reference). However, the system can additionally or alternatively include any other suitable optical modulators, or include no such modulators.

The transducer can optionally include one or more electronic circuits (e.g., electrically coupled to the modulation element(s)), which can function to define and/or control the modulation response to the input optical signal (e.g., create a non-linear response to the input), such as by controlling operation (e.g., resonance properties) of the modulation element(s). For example, the transducer can include a transimpedance amplifier (e.g., inverting transimpedance amplifier). In this embodiment, the signal from the detector (optionally passed through the electronic circuit) preferably drives the modulation element (e.g., as described in U.S. Pat. No. 10,009,135, issued 26 Jun. 2018 and titled "System and Method for Photonic Processing", which is hereby incorporated in its entirety by this reference; for example, such as described regarding the transducer). However, the modulation elements can additionally or alternatively be controlled in any other suitable manner, and/or the detector signal can additionally or alternatively be used in any other suitable manner.

Figure 4C:
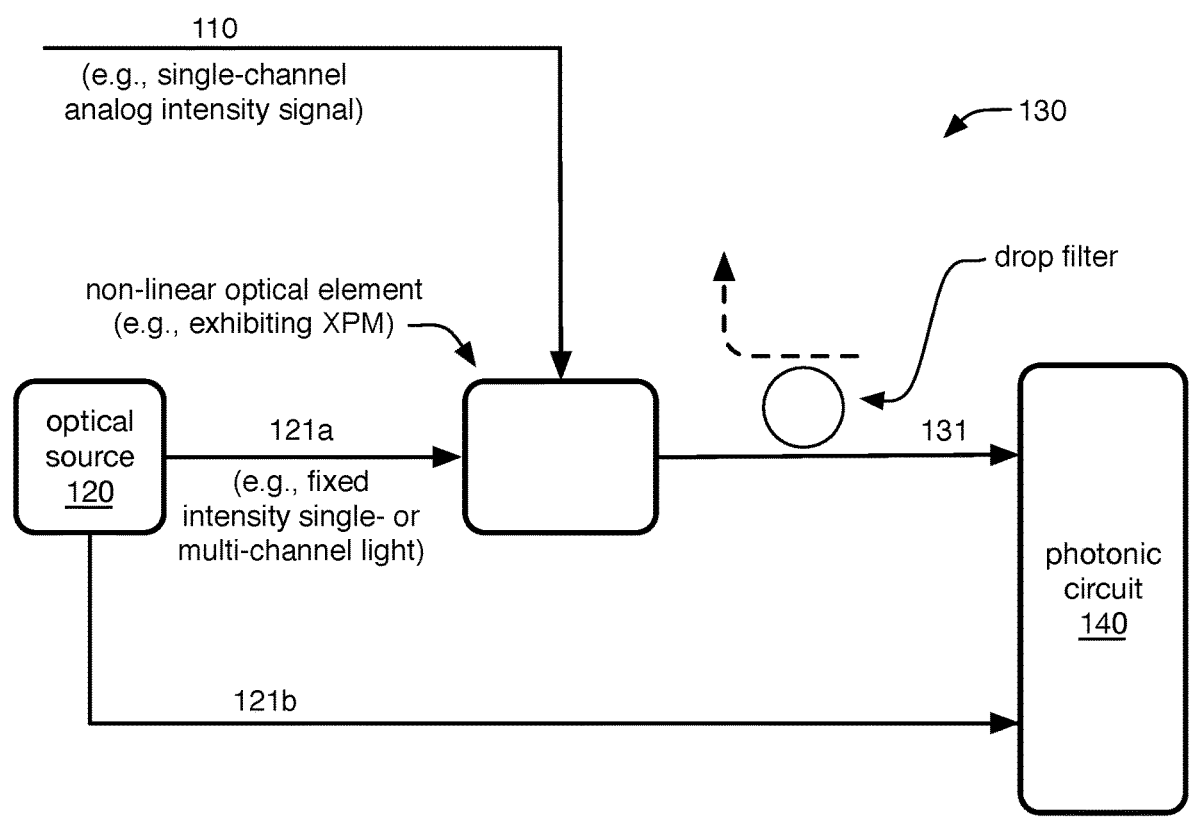

In a second variation of this embodiment, the modulation element can additionally or alternatively modulate the path 121a based on one or more non-linear optical effects (e.g., as described above regarding the first embodiment), such as shown by way of example in FIG. 4C. In this variation, the modulation is preferably performed based on one or more functional operations resulting from the non-linear optical effects (and/or modulator controls), such as XPM. For example, the input signal (or one or more channels, such as wavelength channels, thereof) can modulate the optical source path 121a (or one or more channels, such as wavelength channels, thereof, preferably different channel(s) than those of the input signal) using the XPM effect, thereby generating the phase-modulated optical signal 131 from the optical source path 12ia. In this variation, one or more optical characteristics (e.g., electromagnetic wave characteristics, such as wavelength, mode, polarization, etc.) of the optical input (e.g., of the channel(s) thereof responsible for modulating the optical source path 121a) preferably differ from those of the optical source (e.g., thereby enabling modulation of the optical source by the optical input due to XPM, thereby enabling subsequent separation of the optical input from the phase-modulated optical signal 131, etc.). In this variation, the phase remodulator 130 preferably includes a drop filter (e.g., wavelength-selective filter such as a microdisk, microring, and/or other microresonator; mode- and/or polarization-selective filter; etc.) configured to remove the optical input signal (e.g., based on the differing optical characteristic(s) between the optical input signal and the phase-modulated optical signal 131), such as by separating the optical input signal from the phase-modulated optical signal 131 (e.g., using a drop filter with one or more output waveguides, such as a microresonator that couples either the optical input signal or the phase-modulated optical signal to an output waveguide and does not substantially affect the other signal) and/or by quenching the optical input signal (e.g., wherein the optical input signal is coupled into a drop filter that exhibits significant internal loss). In a first example of this variation, the optical input and optical source have the same (or substantially the same) wavelength (e.g., wherein the mode and/or polarization of the optical input differs from that of the optical source, and so a mode- and/or polarization-selective filter is used as the drop filter). In a second example of this variation, the optical input and optical source have different wavelengths, and the drop filter is preferably a wavelength-selective filter. In a first specific example of this example, the wavelengths differ by (or approximately by) an integer multiple (e.g., 1, 2, 3, 4, 5, 6-10, 10-20, more than 20, etc.) of the free spectral range (FSR) of the non-linear optical element in which XPM occurs (e.g., photonic crystal). In a second specific example (e.g., in which the non-linear optical element includes a slow light enhanced waveguide), the wavelengths differ by an arbitrary amount.

Figure 5:
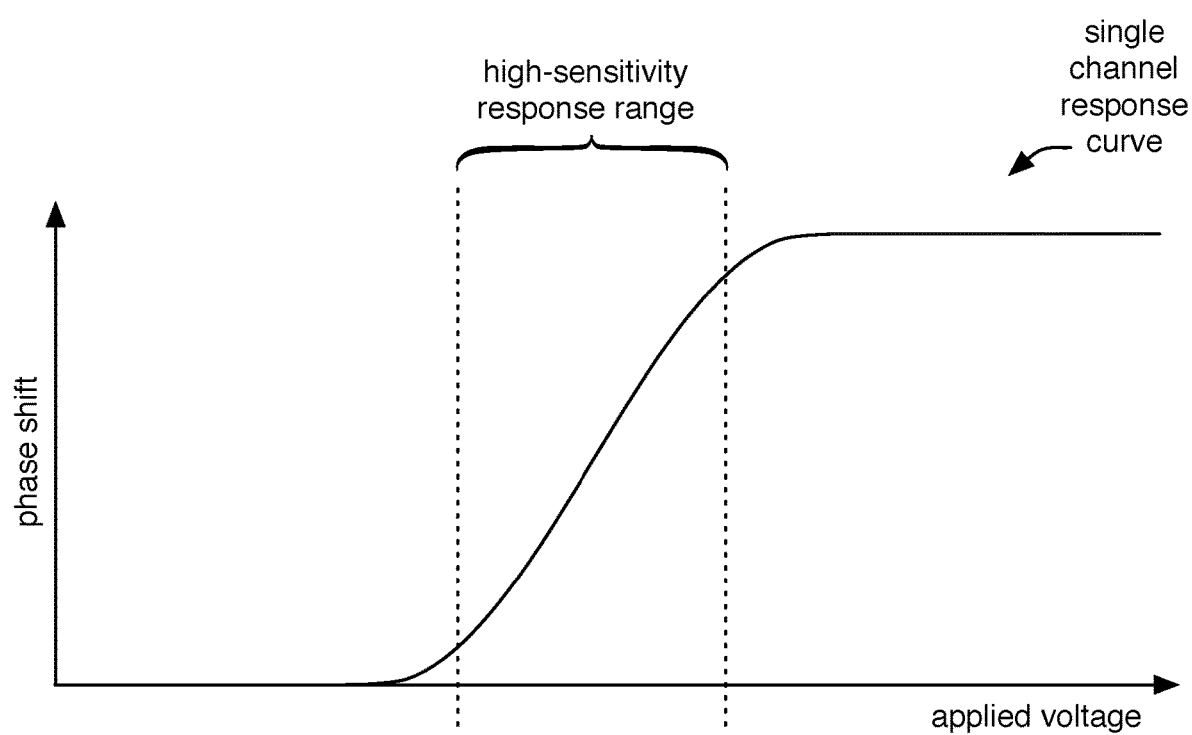
FIG. 5 is a representation of an example of a phase shift response curve associated with a single optical channel.

In a first example of this embodiment, the source 120 is a single-channel source (e.g., as shown in FIGS. 4A-4C). In this example, the expected range of input intensities preferably drives the phase remodulator within a high-sensitivity response range for that channel (e.g., wherein the phase remodulator exhibits a substantially linear phase response with respect to the input intensity and/or modulator voltage, such as shown by way of example in FIG. 5), more preferably not driving the phase remodulator past the high-sensitivity response range.

Figure 6B:
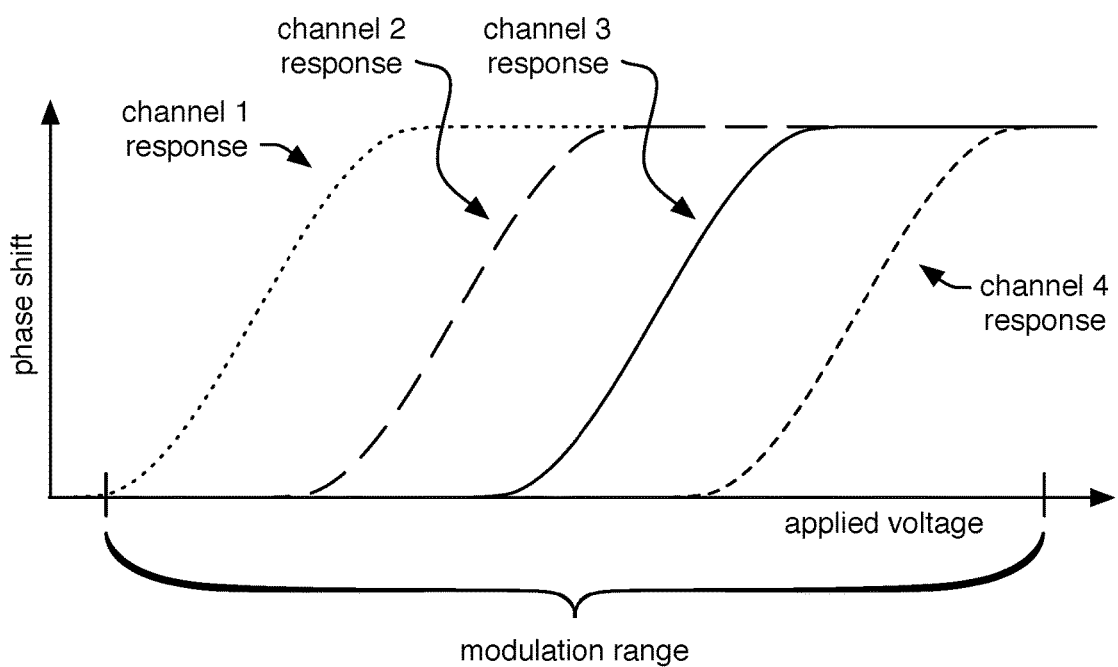
FIG. 6B is a representation of an example of phase shift response curves associated with multiple optical channels.

In a second example, the source 120 is a multi-channel source (e.g., as shown in FIGS. 4B and/or 6A), such as a frequency comb or a plurality of single-channel emitters. In this example, the channels are preferably spaced (in wavelength space) such that the high-sensitivity response ranges (e.g., substantially linear phase response ranges) for the channels slightly overlap the response ranges of the neighboring channels (e.g., as shown in FIG. 6B). In this example, the expected range of input intensities preferably drives the remodulator within the set of high-sensitivity response ranges defined by the channels of the source, such as wherein a modulation band of the remodulator is tunable, in response to the input intensity, over a modulation window, preferably a modulation window that spans, substantially spans, or spans more than a threshold fraction (e.g., 30, 50, 65, 75, 800, 85, 90, 95, 98, 0-30, 30-65, 60-80, 80-90, and/or 90-100%, etc.) of the set of high-sensitivity response ranges.

Figure 1C:
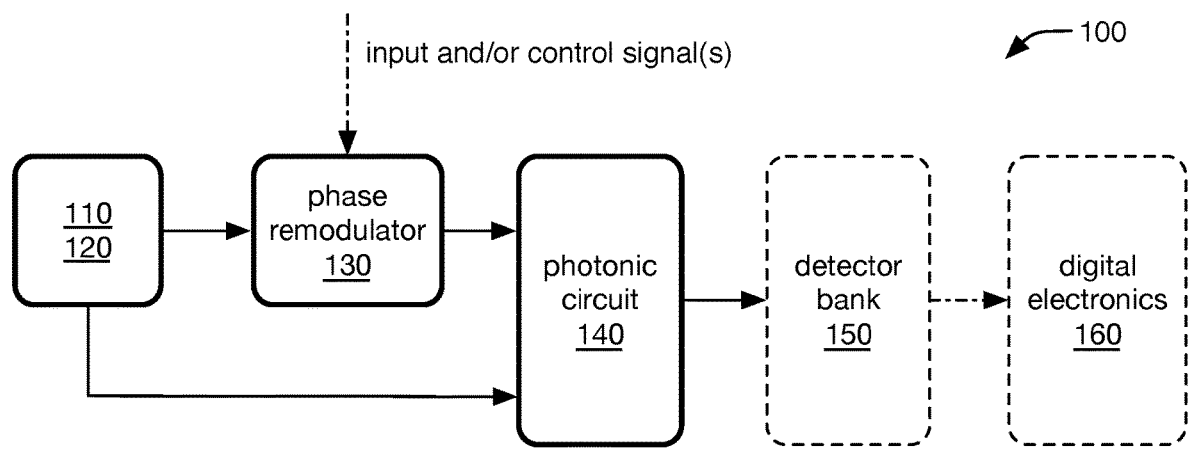

In alternate embodiments, the phase remodulator 130 may additionally or alternatively perform electronic and/or photonic computational tasks (e.g., wherein the output of such tasks is provided as the phase-modulated optical signal 131). For example, the phase remodulator 130 can accept one or more electrical and/or optical input and/or control signals, and, based on these signals, can phase modulate the optical input 110 and/or the light of the light path 121a to generate the phase-modulated optical signal 131, such as shown by way of example in FIGS. 1C and/or 2C.

Figure 1D:
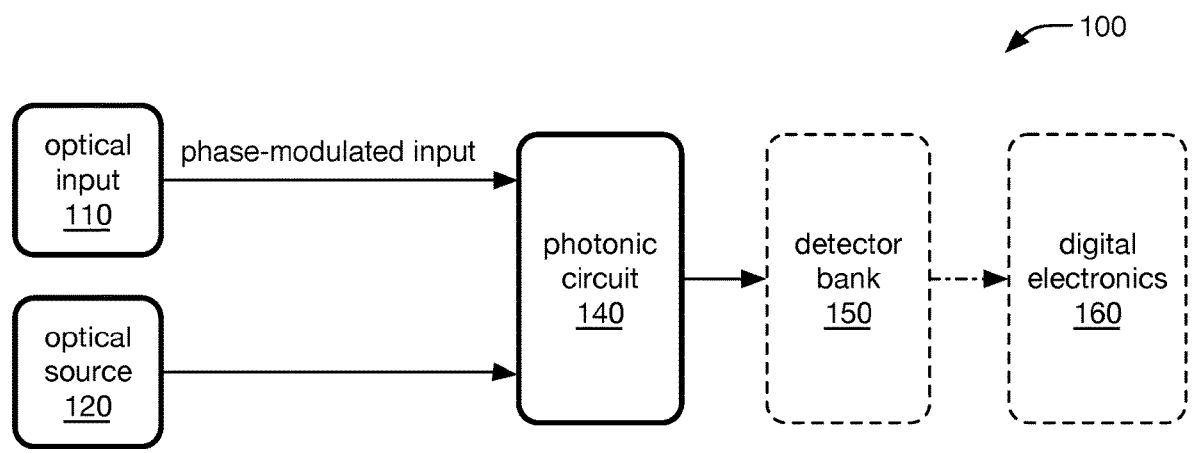

In further alternate embodiments (e.g., in which the optical input 110 includes a phase-modulated signal, preferably a signal phase-modulated relative to the optical source 120 and/or light path 121b), the system 100 may not include a phase remodulator. In such embodiments, the optical input 110 can be used as described below regarding the phase-modulated optical signal 131 (e.g., provided, along with the unmodulated light of the light path 121b, to the photonic circuit 140), such as shown by way of example in FIGS. 1D and/or 2D.

However, the phase remodulator 130 can additionally or alternatively include any other suitable elements in any suitable arrangement.

2.4 Photonic Circuit.

The photonic circuit 140 preferably functions to generate a plurality of optical outputs based on the phase-modulated optical signal 131. The photonic circuit preferably includes one or more passive photonic elements. The photonic circuit preferably accepts two inputs, the phase-modulated optical signal 131 and the unmodulated source from path 121b, but can additionally or alternatively accept any other suitable inputs. The photonic circuit preferably generates a plurality of outputs 141 (e.g., m total outputs, for an integer m). The outputs 141 are preferably generated based on interference between the inputs. A characteristic output (e.g., highest-intensity output, lowest-intensity output, transitional output between high- and low-intensity outputs, etc.) preferably corresponds to the intensity of the optical input 110, such as wherein the outputs define a unary-coded (e.g., thermometer-scale, one-hot, etc.) output. However, the photonic circuit can additionally or alternatively define any other suitable outputs (with any suitable encodings).

The photonic circuit preferably includes one or more couplers 142. The coupler can be a multi-mode interference coupler (MMI coupler), a star coupler, an inverse design coupler, and/or any other suitable coupler. For a photonic circuit with m outputs 141, the coupler is preferably a 2×m coupler (or, for a photonic circuit that includes channel-based filters such as described below, a 2×m/k coupler), but can alternatively have any other suitable number of inputs and/or outputs.

Figure 7A:
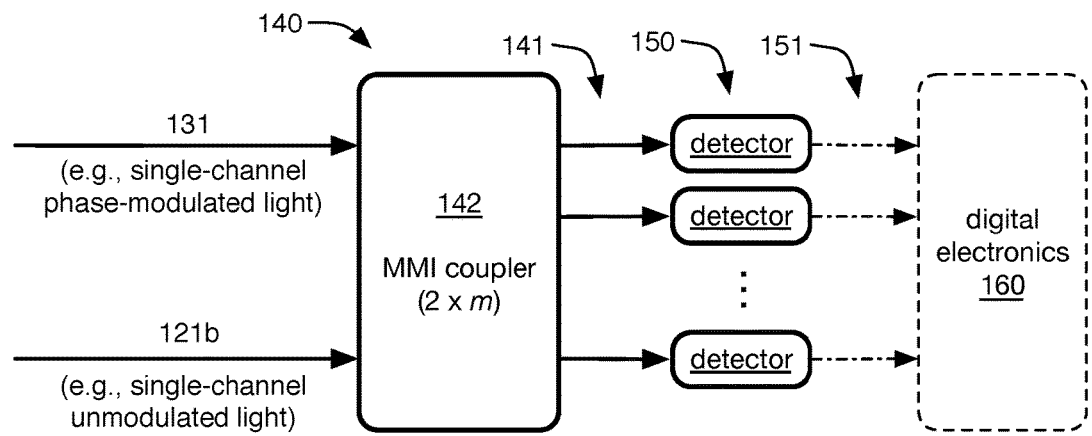
FIG. 7A is a schematic representation of a first embodiment of a photonic circuit.
Figure 7B:
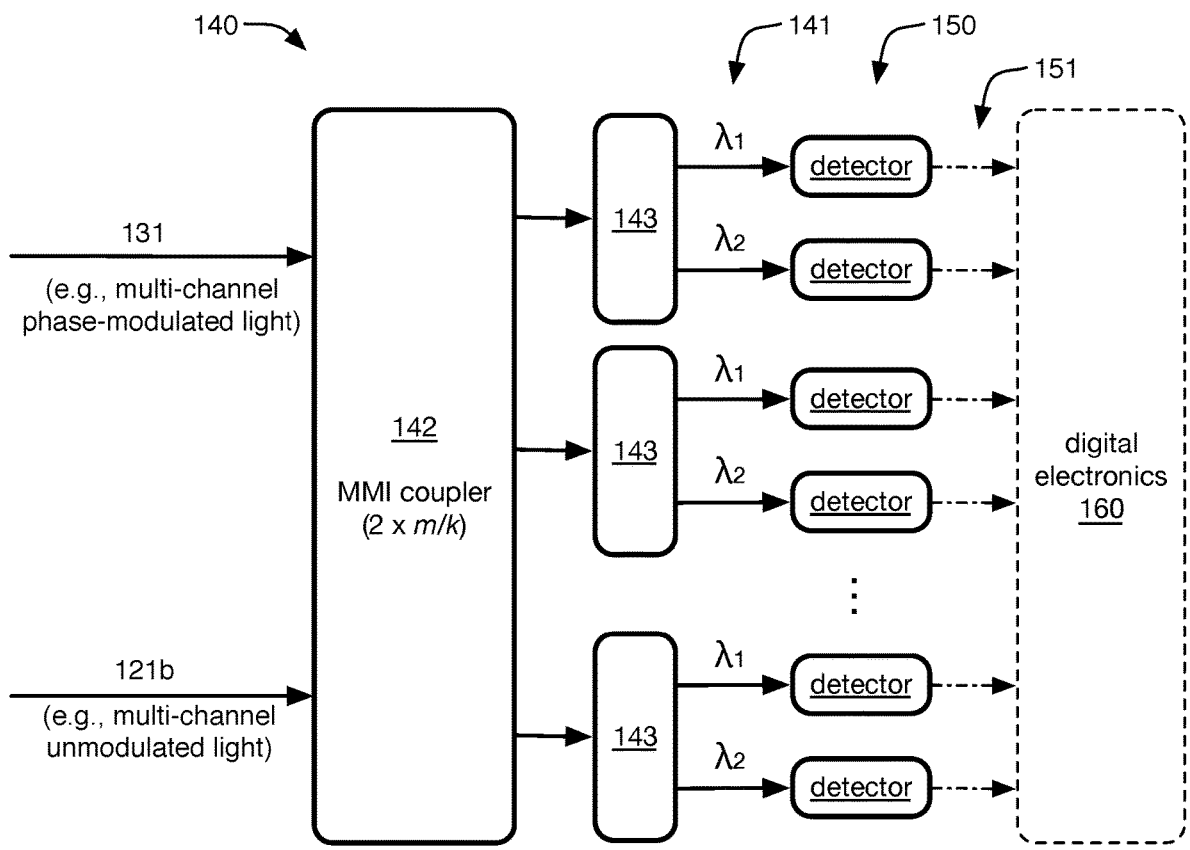
FIGS. 7B-7C are schematic representations of a first and second example, respectively, of a second embodiment of the photonic circuit.
Figure 7C:
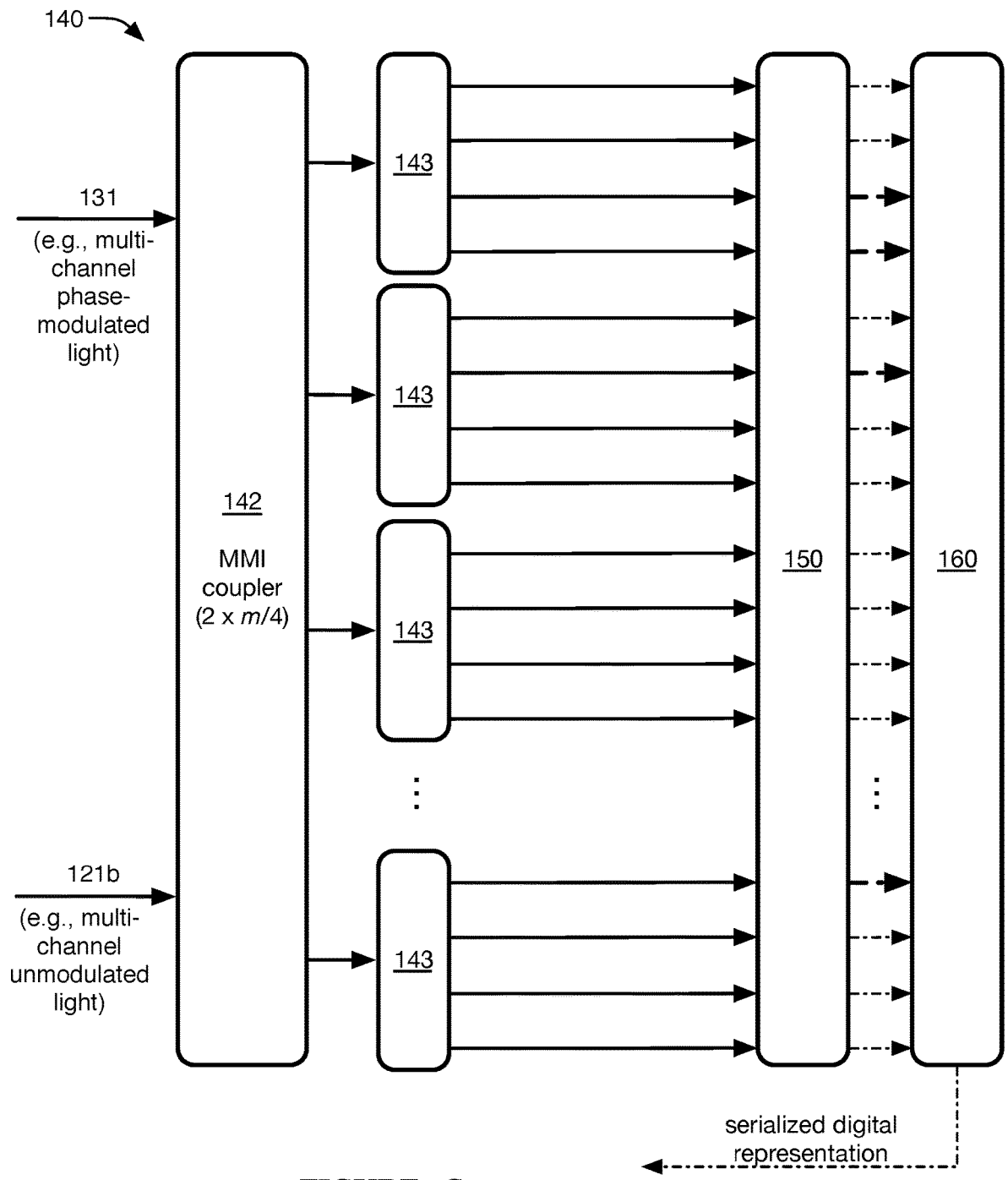
Figure 8:
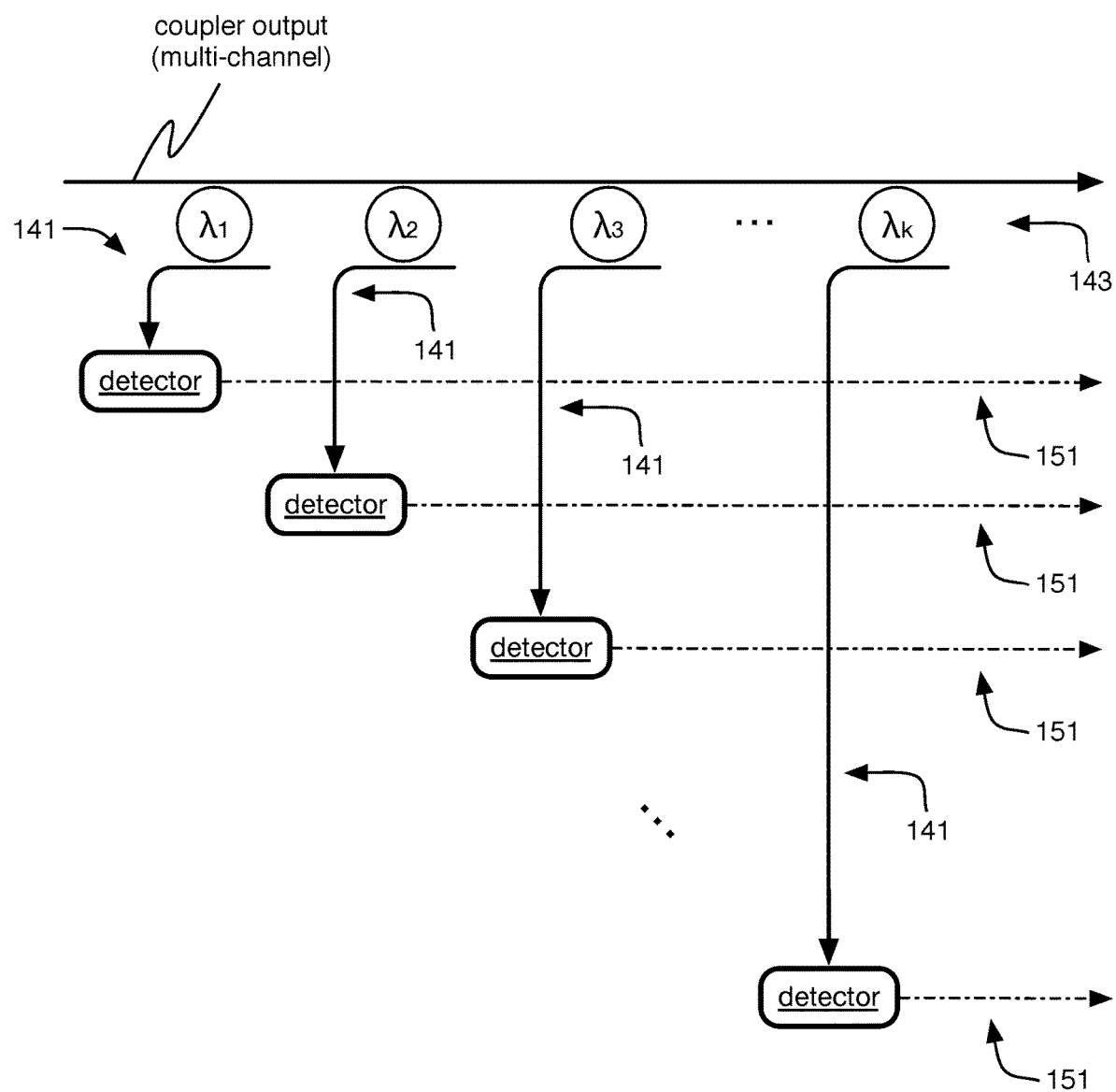
FIG. 8 is a schematic representation of an embodiment of a spectral filter bank and a portion of a detector bank.

The photonic circuit can optionally include one or more channel-based filters (e.g., in embodiments in which the source includes multiple channels, such as k channels for an integer k). The filters are preferably spectral filters, but can additionally or alternatively include mode filters (e.g., in embodiments including mode-based channels) and/or any other suitable filters. The filters preferably split each coupler output into k single-channel outputs 141 (e.g., wherein m/k coupler outputs are split into a total of m single-channel outputs 141). For example, the photonic circuit can include one or more spectral filter banks 143 coupled to the coupler outputs (preferably, m/k spectral filter banks 143, each coupled to a different output of the coupler), wherein each filter of each bank preferably couples a signal (e.g., single-channel output) to a different detector of the detector bank (e.g., as shown in FIGS. 7B, 7C, and/or 8).

1.5 Detector Bank.

The detector bank 150 can function to convert optical signals (e.g., the optical outputs 141 from the photonic circuit 140) into electrical signals (e.g., a unary-coded electrical signal, such as a one-hot or thermometer-coded signal, etc.). The detector bank 150 preferably includes a plurality of detectors (e.g., as shown in FIGS. 7A, 7B, 7C, 8, and/or 9B), more preferably including m detectors (e.g., wherein the detectors and optical outputs 141 define a bijective mapping, such that each of the m outputs is mapped to a different one of the m detectors). Each detector is preferably configured to detect the intensity (and/or any other suitable characteristics) of a photonic circuit output 141 (e.g., wherein the output 141 is directed into the detector) and to provide an electrical output 151 (however, in alternate embodiments, the detector can additionally or alternatively provide an optical output, such as wherein the detector bank converts the optical signals into an optical output signal, preferably a unary-coded optical output signal, and/or can provide any other suitable outputs).

Figure 9:
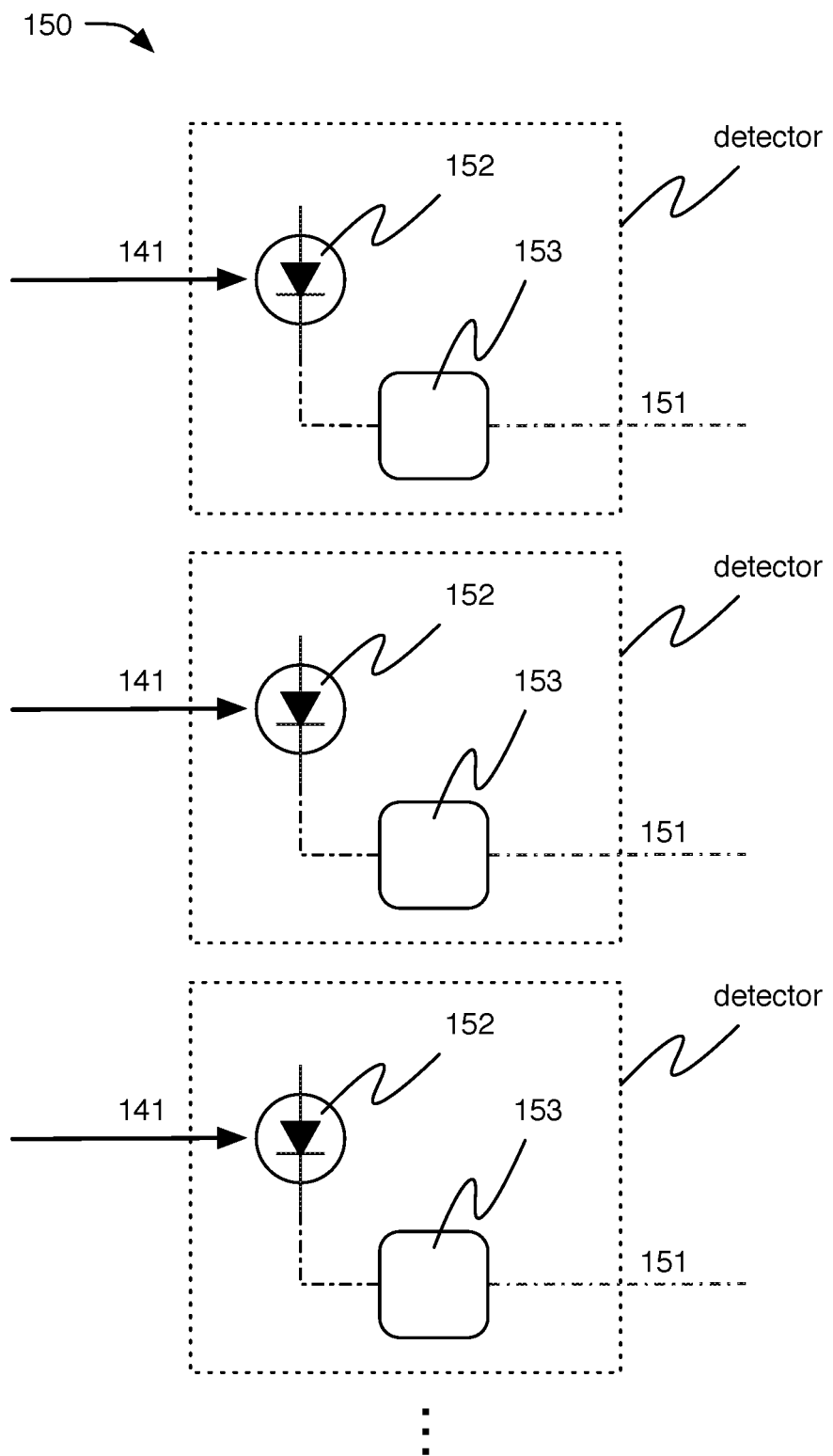
FIG. 9 is a schematic representation of an embodiment of a detector bank.
Figure 10A:
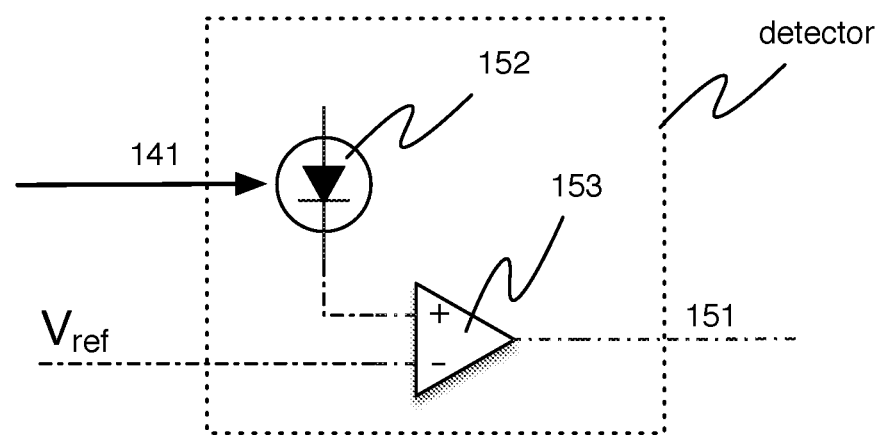
FIGS. 10A-10B are schematic representations of an example of a detector and a detector bank, respectively.
Figure 10B:
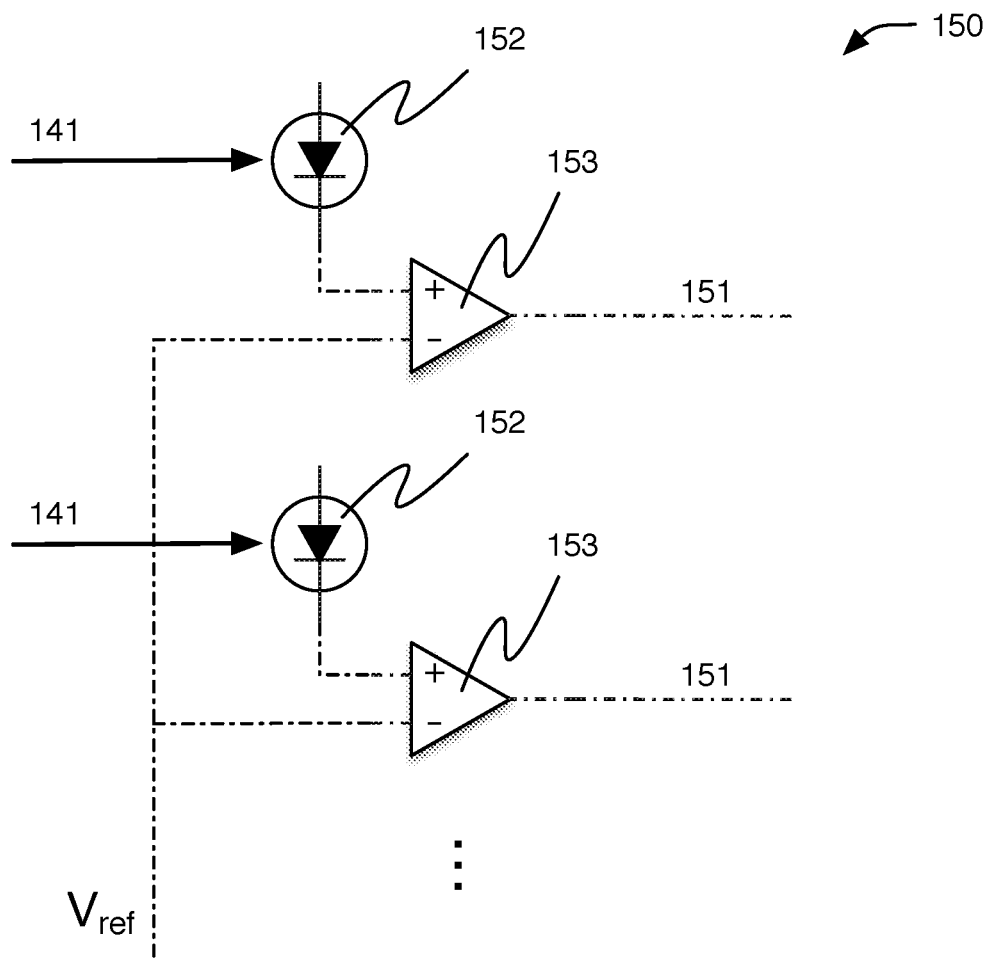

Each detector preferably includes one or more optoelectronic transducers 152 (e.g., photodiodes) and electronic receivers 153 (e.g., comparator, such as inverter and/or op-amp based comparator; flip-flop, such as SR latch, D latch, T latch, and/or JK latch; transimpedance amplifier (TIA); passive receiver; etc.), such as shown by way of example in FIGS. 9, 10A, and/or 10B. The electronic receivers 153 can optionally include one or more inductors and/or any other suitable passive circuit elements (e.g., configured to enhance receiver performance, such as by inductive peaking). The transducer preferably accepts an optical input (e.g., photonic circuit output 141) and transduces it into an electrical output provided to the associated electronic receiver (e.g., wherein the electronic receiver converts the optoelectronic transducer output into a voltage signal suitable for delivery to the digital electronics 160). In one variation, a passive receiver includes one or more passive parasitic components configured to convert the optoelectronic transducer output into a voltage signal suitable for delivery to the digital electronics 160. In this variation, the components preferably include one or more resistors (e.g., configured to produce a voltage signal proportional to the current, delivered from the optoelectronic transducer output, flowing through the resistor), but can additionally or alternatively include capacitors, inductors, and/or any other suitable components.

The properties of each electronic receiver are preferably substantially similar, but can alternatively differ from each other. For example, in embodiments in which the electronic receivers include comparators, each comparator preferably has the same reference threshold, but can alternatively have different thresholds than the other comparators. The threshold is preferably proportional to the intensity of the optical source 120. For example, the threshold can be preset (e.g., for a fixed or a substantially fixed optical source intensity). In an alternative example, the threshold can be determined based on the optical source intensity, such as wherein a detector samples the optical source intensity (e.g., a predefined fraction split from the optical source) and outputs a reference signal (e.g., with a linear or substantially linear dependence on the source intensity), wherein the threshold is defined based on the reference signal (e.g., equal or proportional to the reference signal). However, the detector bank 150 can additionally or alternatively include any other suitable elements in any suitable arrangement.

1.6 Digital Electronics.

The digital electronics 160 can include, for example, one or more encoders (e.g., binary encoder). The encoder can function to convert the electrical signal (e.g., signal from the detector bank, such as the unary-coded signal) into a binary encoding (or any other suitable digital encoding). The encoder is preferably an n-bit encoder (configured to provide an n-bit output signal), wherein m≥$2^n$−1 (for m outputs from the detector bank 150), more preferably wherein m=$2^n$ or m=$2^n$−1. The output signal (e.g., n-bit output signal) can be provided using multiple electrical outputs (e.g., n different electrical leads) and/or can be serialized (e.g., onto a single electrical output, such as by encoding an n-channel TDM signal). However, the digital electronics 160 can additionally or alternatively include any other suitable electronics with any suitable functionality, and/or the system 100 can additionally or alternatively include any other suitable elements in any suitable arrangement.

1.7 Material Platforms.

The system can include (e.g., be made of) any suitable materials. The system (and/or elements thereof, such as some or all of the photonic elements) can be implemented on one or more material platforms, such as photonic integrated circuit platforms (e.g., silicon photonics platforms, monolithically integrated photonics and electronics platforms, other photonic platforms, etc.), microelectronic platforms, and/or any other suitable material platforms. In a first embodiment, the system is implemented as a monolithic platform (e.g., including both photonic elements and electronic elements on a single chip). In a second embodiment, the system is implemented as a heterogeneously integrated platform, such as a platform including two or more chips (e.g., with electronic and/or photonic interfaces between the chips). For example, the heterogeneously integrated platform can include a photonics chip including photonic elements (e.g., and relatively few or no electronic elements, relatively few or no electronic elements with fabrication dimensions below a threshold, etc.; alternatively, including significant electronic elements) and an electronics chip including electronic elements (e.g., and few or no photonic elements; alternatively, including significant photonic elements). In some examples (e.g., of the second embodiment), the system is fabricated via co-integration (e.g., between electronics and photonics), such as wherein different elements of the system can be joined together (e.g., for wafer-to-wafer, die-to-wafer, and/or die-to-die bonding) using one or more packaging technologies such as flip chip bonding, wafer bonding (e.g., direct bond interconnect, hybrid bonding, etc.), through-oxide vias (TOVs), through-silicon vias (TSVs), metal bonding (e.g., eutectic bonding), adhesive bonding, and/or any other suitable bonding interfaces.

In one embodiment, the system can include elements implemented in a silicon photonics platform (e.g., implemented by one or more foundries such as APSUNY, IME, IMEC, GlobalFoundries, TSMC, etc.), which can include silicon, silicon doping, silicon oxides, passive silicon components (e.g., waveguides, filters, etc.), and/or germanium-based elements (e.g., detectors, filters and/or modulators, such as EAMs, etc.). Additionally or alternatively, the system can include elements implemented in one or more III-V platforms (e.g., JePPiX consortium SMART Photonics and/or HHI platforms, Infinera, AIM Photonics, etc.), which can include materials such as indium compounds, phosphide compounds, gallium compounds, arsenide compounds, and/or any other suitable III-V semiconductors (e.g., InGaAsP alloys, such as InP or GaAs substrate with InGaAsP features). In an example of this embodiment, the emitters (e.g., laser array) are fabricated in the III-V semiconductor platform, the multiplexer is fabricated in either the III-V semiconductor platform or the silicon photonics platform, and substantially all other photonic elements of the system (e.g., except some or all waveguides associated with the emitters) are fabricated in the silicon photonics platform. In some examples, the elements can be co-integrated with elements implemented in an electronics platform (e.g., integrated such as described above regarding packaging technologies). In some such examples, one or more electronic elements (e.g., transistors) are fabricated in the photonics platform rather than the electronics platform (e.g., thereby enabling and/or facilitating use of high-voltage elements that exceed the voltage limits of the electronics platform). For example, in a system in which elements from a 7 nm electronics platform (e.g., with a 0.6-0.8V limit, such as a 0.65, 0.7, or 0.75 V limit) are coupled with elements from a silicon photonics platform, the silicon photonics platform elements can include transistors (e.g., configured to amplify signals received from the electronics platform elements) operating with voltages in excess of the electronics platform limit.

The system can additionally or alternatively include elements implemented in a monolithically integrated photonics and electronics platform (e.g., platform typically used for microelectronics) such as a monolithically integrated silicon photonics and electronics platform, preferably wherein some or all photonic and electronic elements of the system are implemented monolithically (e.g., collocated in the same integrated circuit). Additionally or alternatively, the systems can include elements implemented in a co-integrated electronic and photonic platform, such as one that includes front-end-of-line (FEOL) modifications to a standard microelectronic fabrication process and/or back-end-of-line (BEOL) modifications for the fabrication of integrated photonic components (e.g., with low capacitance links to the electronics).

The system can additionally or alternatively include elements implemented in a hybrid silicon/III-V photonics platform, such as wherein silicon photonics elements and III-V photonics elements (e.g., optical amplifiers, laser sources, etc.) are implemented monolithically (e.g., collocated in the same integrated circuit). For example, a III-V semiconductor substrate (e.g., InP) can support both the silicon photonics elements and III-V photonics elements.

The system can additionally or alternatively include elements implemented in a silicon nitride photonics platform (e.g., JePPiX consortium TriPLeX platform), such as including waveguides defined by silicon nitride within a silicon oxide.

The system can additionally or alternatively include elements implemented in a silicon-graphene photonics platform, such as wherein one or more photonic elements (e.g., active elements, such as detectors, filters, modulators, etc.) are implemented using graphene, other graphitic materials, and/or other 2-D materials.

The system can additionally or alternatively include elements implemented in a lithium niobate photonics platform, which can include one or more photonic elements implemented using lithium niobate, such as thin-film lithium niobate.

In a specific example, the system includes elements fabricated such as described in U.S. Pat. No. 8,027,587, issued 27 Sep. 2011 and titled "Integrated Optic Vector-Matrix Multiplier", which is hereby incorporated in its entirety by this reference (e.g., elements fabricated as described regarding fabrication on silicon-on-insulator wafers).

A person of skill in the art will recognize that the elements described herein using the term "waveguide" can additionally or alternatively include any other suitable optical paths and/or elements associated with optical paths (including, without limitation, free-space paths and/or paths including free-space segments).

However, the system can additionally or alternatively be implemented in any other suitable material platform, and can additionally or alternatively include any other suitable materials.

3. Method.

The method 200 is preferably implemented using the system 100 described above, but can additionally or alternatively be implemented using any other suitable system(s).

Receiving the optical input signal S210 preferably functions to receive the analog signal to be digitized. In one example, the optical input signal is received from a photonic computer (or one or more photonic computing elements, such as a photonic processor), such as a photonic computer including systems and/or implementing methods such as described in U.S. Pat. No. 10,009,135, issued 26 Jun. 2018 and titled "System and Method for Photonic Processing", which is hereby incorporated in its entirety by this reference. For example, the optical input signal can be received from the photonic computing element(s).

However, S210 can additionally or alternatively include receiving any other suitable optical input signal(s).

Generating a phase-modulated optical signal S220 is preferably performed at the phase remodulator. The optical signal is preferably generated based on the optical input signal, but can additionally or alternatively be generated in any other suitable manner.

The phase-modulated optical signal is preferably representative of the optical input signal. For example, one or more aspects of the modulation and/or resulting signal (e.g., phase remodulator control setting such as voltage, current, and/or temperature; extent of phase modulation; etc.) is preferably related to (e.g., substantially proportional to) the input signal intensity.

In examples including a multi-channel optical source, each channel of the source is preferably mapped to a range of the input signal intensity (e.g., different from the ranges mapped to the other channels, more preferably substantially contiguous with and/or minimally-overlapping the ranges mapped to the other channels). In such examples, if the input signal intensity is within the range mapped to a particular channel, then the phase modulation of that channel is preferably related to the input signal intensity (e.g., relative to the mapped range, such as proportional to the difference between the input signal intensity and a reference value of the mapped range, such as its minimum, maximum, or center). For example, in a system with k channels, m detectors, and a 2×n coupler, wherein n=m/k, the first channel can be mapped to the first n values, the second channel can be mapped to the second n values, the kth channel can be mapped to the final n values, and so on.

Figure 11A:
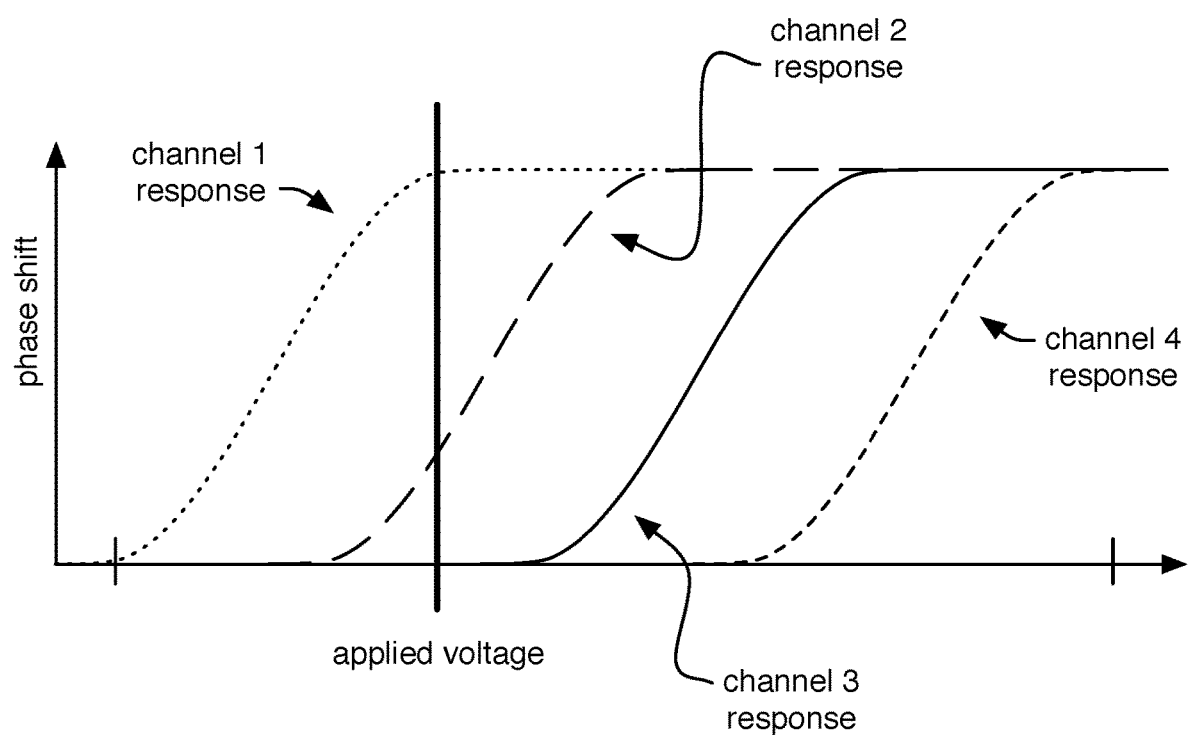
FIG. 11A is a representation of an example of signals encoded based on the phase shift response curves associated with multiple optical channels.
Figure 11B:
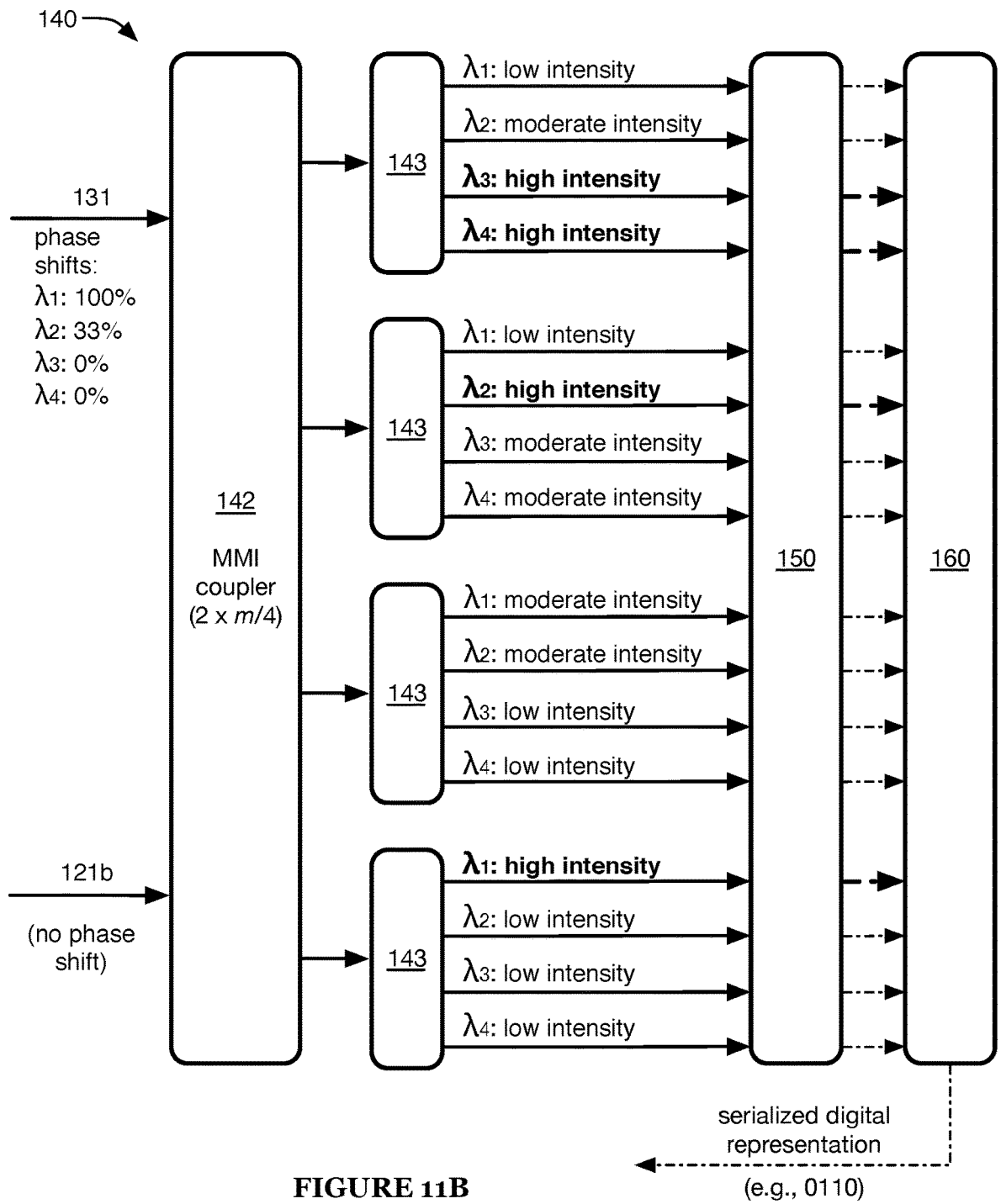
FIG. 11B is a schematic representation of an example of the signals of FIG. 11A received by a specific example of the photonic circuit.

In a specific example (e.g., as shown in FIGS. 11A-11B), the system includes 4 wavelength channels, a 2×4 MMI coupler, and 16 detectors, corresponding to 16 possible output values (e.g., 4-bit precision), or 17 possible output values if including a 0 value. As shown by way of example in FIG. 11A, in response to an applied voltage of approximately 37.5% of the signal range, channel 1 (e.g., corresponding to values 1-4) is maximally-modulated, channel 2 (e.g., corresponding to values 5-8) is modulated by about ⅓ of the maximum phase modulation, and channels 3 and 4 (e.g., corresponding to values 9-12 and 13-16, respectively) are substantially unmodulated. As shown by way of example in FIG. 11B, these modulations result in an MMI output wherein the channel 1 is most intense at the fourth output port (e.g., resulting in a hot output from the 13th detector), channel 2 is most intense at the second output port (e.g., resulting in a hot output from the 6th detector), and channels 3 and 4 are most intense at the first output port (e.g., resulting in hot outputs from the third and fourth detectors, respectively). Based on these outputs, the digital logic determines that the relevant value was encoded by channel 2 (e.g., because channel 2 is the lowest-numbered channel to produce a high intensity output at an MMI output port other than the last port). Channel 2 corresponds to the range 5-8, and has produced a high intensity output at the second port, and so the value represented is 6 (e.g., having a serialized digital representation of 0110).

However, S220 can additionally or alternatively include generating the phase-modulated optical signal in any other suitable manner.

Generating the plurality of optical outputs S230 is preferably performed by the photonic circuit. The optical outputs are preferably generated based on interference between the phase-modulated signal and unmodulated signal, but can additionally or alternatively be generated in any other suitable manner.

Generating the plurality of electrical outputs S240 is preferably performed by the detector bank. The electrical outputs are preferably generated based on the optical outputs (e.g., generated in S230). The plurality of electrical outputs preferably define a unary (e.g., 1-hot, thermometer-coded, etc.) output (e.g., wherein exactly one output of the plurality is in a high or on state at any particular time; wherein no more than one output is in the high or on state; wherein a first contiguous set of outputs are in the high or on state, and a second contiguous set of outputs are in a low or off state, wherein all outputs are in either the first or second contiguous set; etc.). However, S240 can additionally or alternatively include generating any other suitable electrical outputs.

Encoding the digital representation S250 is preferably performed by the digital electronics S250 can function to provide a more compact and/or efficient representation of the digitized signal (e.g., floating point digital representation, fixed point digital representation, endian digital representation such as big- or little-endian, significand digital representation, mantissa digital representation, etc.). The digital representation is preferably encoded based on the plurality of electrical outputs (e.g., generated in S240), but can additionally or alternatively be encoded based on any other suitable information. S250 is preferably performed based on the relationship (e.g., known and/or predefined relationship) between the optical input signal and the phase-modulated optical signal.

In embodiments including a multi-channel optical source, S250 is preferably performed based on the mappings between the channels and the input signal intensity ranges, such as wherein the appropriate signal intensity range is determined based on the signals associated with each optical channel. For example, all channels except one may generate signals indicative of an extremal phase shift, whereas the other channel (the "active channel") may generate signals indicative of an intermediate phase shift (e.g., within the high-sensitivity range, such as described above). These signals indicative of an intermediate phase shift can be used to determine which channel is the active channel, and thus used to identify the signal intensity range mapped to the active channel. In this example, the channels mapped to signal intensity ranges below the active channel's range may have the minimum phase shift and channels mapped to signal intensity ranges above the active channel's range may have the maximum phase shift, or vice versa (or the non-active channels may generate any other suitable signals).

S250 can additionally or alternatively include encoding any other suitable digital representation. However, S250 and/or the method 200 can additionally or alternatively include any other suitable elements performed in any suitable manner.

Although omitted for conciseness, the preferred embodiments include every combination and permutation of the various system components and the various method processes. Furthermore, various processes of the preferred method can be embodied and/or implemented at least in part as a machine configured to receive a computer-readable medium storing computer-readable instructions. The instructions are preferably executed by computer-executable components preferably integrated with the system. The computer-readable medium can be stored on any suitable computer readable media such as RAMs, ROMs, flash memory, EEPROMs, optical devices (CD or DVD), hard drives, floppy drives, or any suitable device. The computer-executable component is preferably a general or application specific processing subsystem, but any suitable dedicated hardware device or hardware/firmware combination device can additionally or alternatively execute the instructions.

The FIGURES illustrate the architecture, functionality and operation of possible implementations of systems, methods and computer program products according to preferred embodiments, example configurations, and variations thereof. In this regard, each block in the flowchart or block diagrams may represent a module, segment, step, or portion of code, which comprises one or more executable instructions for implementing the specified logical function(s). It should also be noted that, in some alternative implementations, the functions noted in the block can occur out of the order noted in the FIGURES. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As a person skilled in the art will recognize from the previous detailed description and from the figures and claims, modifications and changes can be made to the preferred embodiments of the invention without departing from the scope of this invention defined in the following claims.

We claim:

1. A method for analog-to-digital conversion, the method comprising:
   receiving an analog input signal and a first optical carrier;
   based on the analog input signal, modulating a phase of the first optical carrier to generate a phase-modulated optical signal;
   at a photonic circuit, receiving the phase-modulated optical signal and a second optical carrier;
   at the photonic circuit, generating a spatially-separated plurality of optical outputs based on the phase-modulated optical signal, comprising, at a coupler of the photonic circuit, interfering the phase-modulated optical signal with the second optical carrier;
   at a detector bank comprising a plurality of detectors, receiving the spatially-separated plurality of optical outputs, wherein each optical output of the spatially-separated plurality of optical outputs is received by a different detector of the plurality of detectors; and
   at the detector bank, generating a set of binary outputs, comprising, for each optical output of the spatially-separated plurality of optical outputs: generating, based on the optical output, a respective binary output of the set;
   wherein the set of binary outputs is indicative of a value associated with the analog input signal.

2. The method of claim 1, wherein the first optical carrier is substantially identical to the second optical carrier.

3. The method of claim 1, further comprising:
receiving an optical carrier input; and
splitting the optical carrier input into the first and second optical carriers.

4. The method of claim 1, wherein the analog input signal is an optical signal.

5. The method of claim 4, wherein modulating the phase of the first optical carrier to generate the phase-modulated optical signal comprises, at a non-linear optical element:
receiving the analog input signal and the first optical carrier; and
modulating the phase of the first optical carrier via a non-linear optical effect.

6. The method of claim 5, wherein the first optical carrier is the analog input signal.

7. The method of claim 6, wherein the non-linear optical effect results in self-phase modulation of the first optical carrier within the non-linear optical element.

8. The method of claim 5, wherein:
the first optical source comprises light within a first wavelength band;
the analog input signal comprises light within a second wavelength band, wherein the first and second wavelength bands are non-overlapping; and
the non-linear optical effect results in cross-phase modulation of the first optical carrier within the non-linear optical element.

9. The method of claim 8, further comprising, after modulating the phase of the first optical carrier, separating the light within the second wavelength band from the phase-modulated optical signal via spectral filtering.

10. The method of claim 1, wherein:
the analog input signal is an electrical signal;
the analog input signal is received at a phase modulator; and
the phase modulator modulates the phase of the first optical carrier to generate the phase-modulated optical signal.

11. The method of claim 10, wherein the phase modulator is a microresonator.

12. The method of claim 10, wherein:
the first optical carrier comprises light within a plurality of wavelength channels;
the phase modulator is a wavelength-selective modulator associated with a modulation band, wherein the modulation band is tunable, in response to the analog input signal, over a modulation window that spans the plurality of wavelength channels; and
modulating the phase of the first optical carrier to generate the phase-modulated optical signal comprises modulating the phase of light of a first wavelength channel of the plurality.

13. The method of claim 12, wherein:
the plurality of wavelength channels consists of k wavelength channels;
the spatially-separated plurality of optical outputs consists of m single-channel outputs; and
generating the spatially-separated plurality of optical outputs further comprises:
receiving, from the coupler, a spatially-separated plurality of multi-channel signals consisting of n multi-channel signals, wherein n=m/k; and
for each multi-channel signal of the plurality, at a respective spectral filter bank, splitting the multi-channel signal into k single-channel outputs.

14. The method of claim 10, further comprising:
receiving an optical analog signal; and
generating the analog input signal based on the optical analog signal.

15. The method of claim 1, wherein the first and second optical carriers are substantially static.

16. The method of claim 1, wherein the coupler comprises a multi-mode interference coupler.

17. The method of claim 1, wherein the set of binary outputs defines a one-hot representation of the value.

18. The method of claim 17, further comprising, based on the set of binary outputs, generating a serialized digital representation of the value.

19. The method of claim 1, wherein each binary output of the set is an electrical output.

20. The method of claim 1, wherein the value is indicative of an intensity of the analog input signal.

* * * * *